(12) United States Patent
Grun

(10) Patent No.: US 7,079,961 B2
(45) Date of Patent: Jul. 18, 2006

(54) METHOD AND APPARATUS FOR MEASURING IMPEDANCE OF ELECTRICAL COMPONENT UNDER HIGH INTERFERENCE CONDITIONS

(75) Inventor: Thomas M. Grun, Allschwil (CH)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 10/920,453

(22) Filed: Aug. 18, 2004

(65) Prior Publication Data

US 2005/0075076 A1 Apr. 7, 2005

Related U.S. Application Data

(60) Provisional application No. 60/496,678, filed on Aug. 21, 2003.

(51) Int. Cl.
G01R 21/00 (2006.01)
G01R 21/06 (2006.01)
G01R 27/00 (2006.01)

(52) U.S. Cl. .................. 702/60; 702/65; 702/191; 324/141; 324/142; 455/67.11

(58) Field of Classification Search ............... None
See application file for complete search history.

(56) References Cited

U.S. PATENT DOCUMENTS

| | | | |
|---|---|---|---|
| 3,842,344 A | 10/1974 | Povey | 324/54 |
| 3,936,730 A | 2/1976 | Pittman | 324/54 |
| 4,384,366 A * | 5/1983 | Kaitsuka | 455/278.1 |
| 4,472,676 A | 9/1984 | Eichmann et al. | 324/51 |
| 4,851,761 A | 7/1989 | Matsuno | 324/62 |
| 4,857,830 A | 8/1989 | Matsuno | 324/62 |
| 4,857,855 A | 8/1989 | Matsuno | 324/521 |
| 5,101,160 A | 3/1992 | Barjonnet et al. | 324/510 |
| 5,469,066 A | 11/1995 | Ito et al. | 324/551 |
| 5,475,709 A * | 12/1995 | Futagami et al. | 375/224 |
| 5,481,198 A | 1/1996 | Patel | 324/700 |
| 5,559,439 A | 9/1996 | Bergeal | 324/509 |
| 5,587,662 A | 12/1996 | Kelley et al. | 324/713 |
| 5,818,245 A | 10/1998 | Allfather | 324/707 |
| 5,990,687 A | 11/1999 | Williams | 324/529 |
| 6,114,983 A * | 9/2000 | Ghose et al. | 342/16 |
| 6,177,803 B1 | 1/2001 | Train et al. | 324/552 |
| 6,812,716 B1 * | 11/2004 | Fawcett | 324/707 |
| 2002/0024342 A1 | 2/2002 | Bussinger | 324/541 |
| 2003/0085715 A1 | 5/2003 | Lubkeman et al. | 324/509 |
| 2003/0160602 A1 | 8/2003 | Anand et al. | 324/126 |

FOREIGN PATENT DOCUMENTS

| | | |
|---|---|---|
| EP | 0 600 726 A2 | 6/1994 |
| JP | 52016255 A | 2/1977 |
| JP | 57149972 A | 9/1982 |

* cited by examiner

Primary Examiner—Marc S. Hoff
Assistant Examiner—Manuel L. Barbee
(74) Attorney, Agent, or Firm—Mark S. Bicks; Alfred N. Goodman; Ronald Grubb

(57) ABSTRACT

A test system and method having a test channel and an additional channel, and wherein the ratio of amplitude and phase between the interference current through the device under test and the interference signal on the additional channel are determined. The system further applies a voltage at or near line frequency to the device under test, and then continuously subtracts the additional interference signal from the current signal through the device under test. In doing so, the system and method allows accurate measurements of the real and reactive power of an impedance at or very close to the line frequency.

13 Claims, 4 Drawing Sheets

METHOD AND APPARATUS FOR MEASURING IMPEDANCE OF ELECTRICAL COMPONENT UNDER HIGH INTERFERENCE CONDITIONS

REFERENCE TO RELATED APPLICATIONS

This application claims benefit under 35 U.S.C. §119(e) from U.S. provisional patent application Ser. No. 60/496,678, entitled "Method And Apparatus For Measuring Impedance Of Electrical Component Under High Interference Conditions" filed Aug. 21, 2003, the entire content of which is expressly incorporated herein by reference.

BACKGROUND OF THE INVENTION

1. Field of the Invention

The present invention relates to a system and method for measuring the leakage impedance and loss angle of a high voltage component or insulation system to determine the condition of the component or system as part of the installation and maintenance procedure.

2. Description of the Related Art

As known to those skilled in the art, the evaluation of electrical insulation in power systems and power system components is of great importance when performing any number of tasks, such as scheduling preventive maintenance, qualifying a power system apparatus going into service, or trouble-shooting an apparatus to determine the cause of an unknown failure or problem.

In such cases, the condition of insulation systems and components can be assessed by measuring the loss angle, or δ, which gives a measure of the performance of the insulation. An ideal insulation system behaves as an ideal capacitor in that, when the system is energized with an alternating voltage, the current that flows in the insulation system is exactly 90° out of phase with the voltage.

A real insulator however, has a finite resistance that appears in parallel with this ideal capacitance value, which causes an energy loss when the system is energized as more clearly shown in FIG. 1. In FIG. 1, a real insulator is illustrated as a model schematic 100 and vector diagram 110, having an ideal capacitance 102 and a parallel finite resistance 104. This resistance 104 reduces the phase angle of the current with respect to the voltage, and the angle of this phase shift is the loss angle (δ) as shown in the vector diagram 110. As shown in diagram 110, as R approaches zero (i.e., $I_R$ increases), the greater the loss angle (δ) becomes. The loss is normally measured in terms of tan (δ), which is defined by the following equation (1), Dissipation Factor (Loss Factor) (1)

$$DF = \tan\delta = \frac{P_R}{Q_C} = \frac{I_R}{I_C} = \frac{X_C}{R} = \frac{1}{\omega CR}$$

wherein C is the capacitance of the insulation system model (i.e. 102), and R is the loss resistance of the insulation system model (i.e. 104). The term "power factor" is also often used and corresponds to equation (1) as defined by the following equation (2), Power Factor (2)

$$PF = \cos\varphi = \frac{IR}{I} = \frac{PR}{SC} = \frac{\tan\delta}{\sqrt{1+\tan^2\delta}}$$

One of the indicators of a deteriorating insulation system or component is that the value of tan (δ) is increasing over time.

The value of tan (δ) has been measured in the past typically using bridge balancing methods such as the Schering bridge, or an inductively coupled ratio arm bridge (e.g., Tettex type 2805). Still other test systems have used direct measurement of a voltage and current value, and then provide electronic processing of the resulting signals to measure the tan (δ) factor. One of the limitations of these methods, however, is the presence of power line frequency fields that induce spurious voltages and currents, also known as interference signals, onto the test object and/or the test system. These prevent a true measurement of the loss angle (δ) from being made.

A number of techniques for reducing the effect of this interference have been developed. The simplest of these techniques is to choose a frequency that is slightly away from the line frequency and using this to energize the test object. The voltage and current are then measured using synchronous detection or interference of the waveforms. This method relies on the assumption that the loss angle (δ) is constant with respect to frequency, which cannot be guaranteed.

An alternative technique is to measure values on either side of the line frequency and thereafter, perform a linear interpolation of the results to establish the loss angle (δ) at the line frequency. This technique has typically required the use of complex synchronous schemes requiring accurate phase shift elements, or multiple discrete measurements with complex digital signal processing noise suppression.

Each of these methods however, does not allow measuring values at line frequency. Accordingly, a need exists for a system and method to measure values, such as the leakage impedance and loss angle (δ) of a high voltage component or insulation system at a line frequency, while minimizing the effects of interference signals.

SUMMARY OF THE INVENTION

Therefore, an object of the present invention is to provide a system and method for measuring the real and reactive power of a system or component at a predetermined line frequency.

Another object of the present invention is to provide a system and method for providing an additional channel in a test system which measures interference signals of the line frequency imposed to the test object by a nearby power line or from a line signal.

Another object of the present invention is to provide a system and method for digitizing the current and the voltage at the test object and the interference signal, and transferring each to a test processor, such as a computer, wherein the additional interference signal is corrected by phase amplitude and is continuously subtracted from the current signal through the device under test.

These and other objects of the present invention are substantially achieved by providing a system and method which provides a test system having an additional channel, and wherein the ratio of amplitude and phase between the interference current through the device under test and the interference signal on the additional channel are determined. The system further applies a voltage at or near line frequency to the device under test and then continuously subtracts the additional interference signal from the current signal through the device under test. In doing so, the system and method allows accurate measurements of the real and reactive power of an impedance at or very close to the line frequency.

BRIEF DESCRIPTION OF THE DRAWINGS

The various objects, advantages and novel features of the preferred embodiments of the present invention will be more readily appreciated from the following detailed description when read in conjunction with the appended drawings, in which.

DETAILED DESCRIPTION OF THE EXEMPLARY EMBODIMENTS

The present invention includes a system and method for measuring the real and reactive power of the impedance of a power system at a predetermined line frequency by providing an additional channel which measures interference signals of the line frequency that are imposed upon the test object by a nearby powerline or from a line signal. The current and the voltage values at the test object and the interference signal are then digitized and transferred to a test processor, such as a computer. Once digitized, the ratio of amplitude and phase between the interference current through the device under test (DUT) and the interference signal on the additional channel can be determined.

A voltage at or near line frequency can then be applied to the device under test. The additional interference signal, corrected by phase amplitude, can be continuously subtracted from the current signal through the device under test. In doing so, the embodiment of the present invention is capable of accurately measuring the real and reactive power of an impedance at or very close to the line frequency. As this system and method requires no filters, it is possible to achieve measurements much closer to the line frequency than with filter algorithms, such as those described in U.S. Pat. No. 5,818,245, entitled "Impedance Measuring", the entire content of which being incorporated herein by reference.

As noted above, the presence of interference signals, such as power line frequency fields, can induce spurious voltages and currents onto the test object and the measurement system which can result in an error in the measuring signal $i_{MEAS}^{(T)}$. To calculate this disturbance, values of the induced interference signal $n^{(t)}$ can be measured by an antenna for interference signals that are imposed by a nearby powerline, or directly from the corresponding power line for interference signals that are imposed from a line signal, as shown in the system and method of FIG. 2 in accordance with an embodiment of the present invention. During the short period over which a measurement is made, other factors including geometrical and environmental conditions such as temperature, humidity, position of equipment, and so forth, are substantially stable. Therefore, the ratio of phase and amplitude between the signals $i_{MEAS}^{(T)}$ and $n^{(t)}$ can be determined and stored at a test start time.

Figure 1:
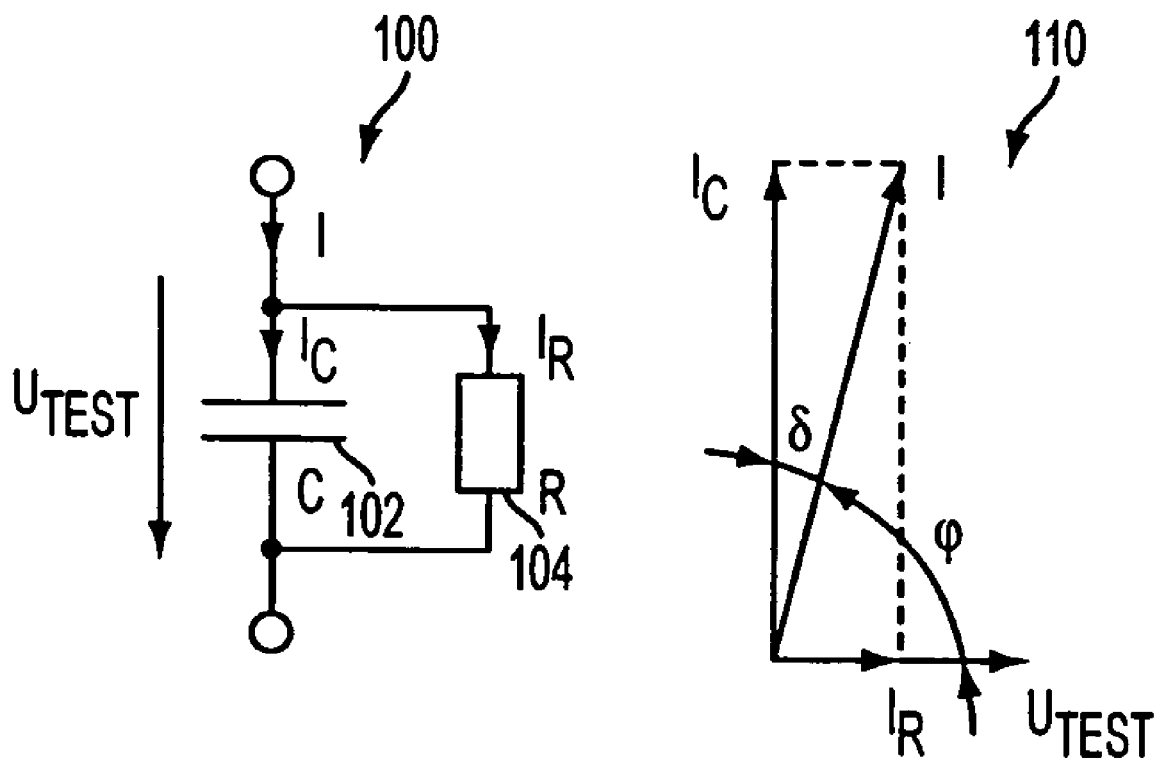
FIG. 1 is a model illustrating a finite resistance that appears in parallel with an ideal capacitance value of a real insulator.
Figure 2:
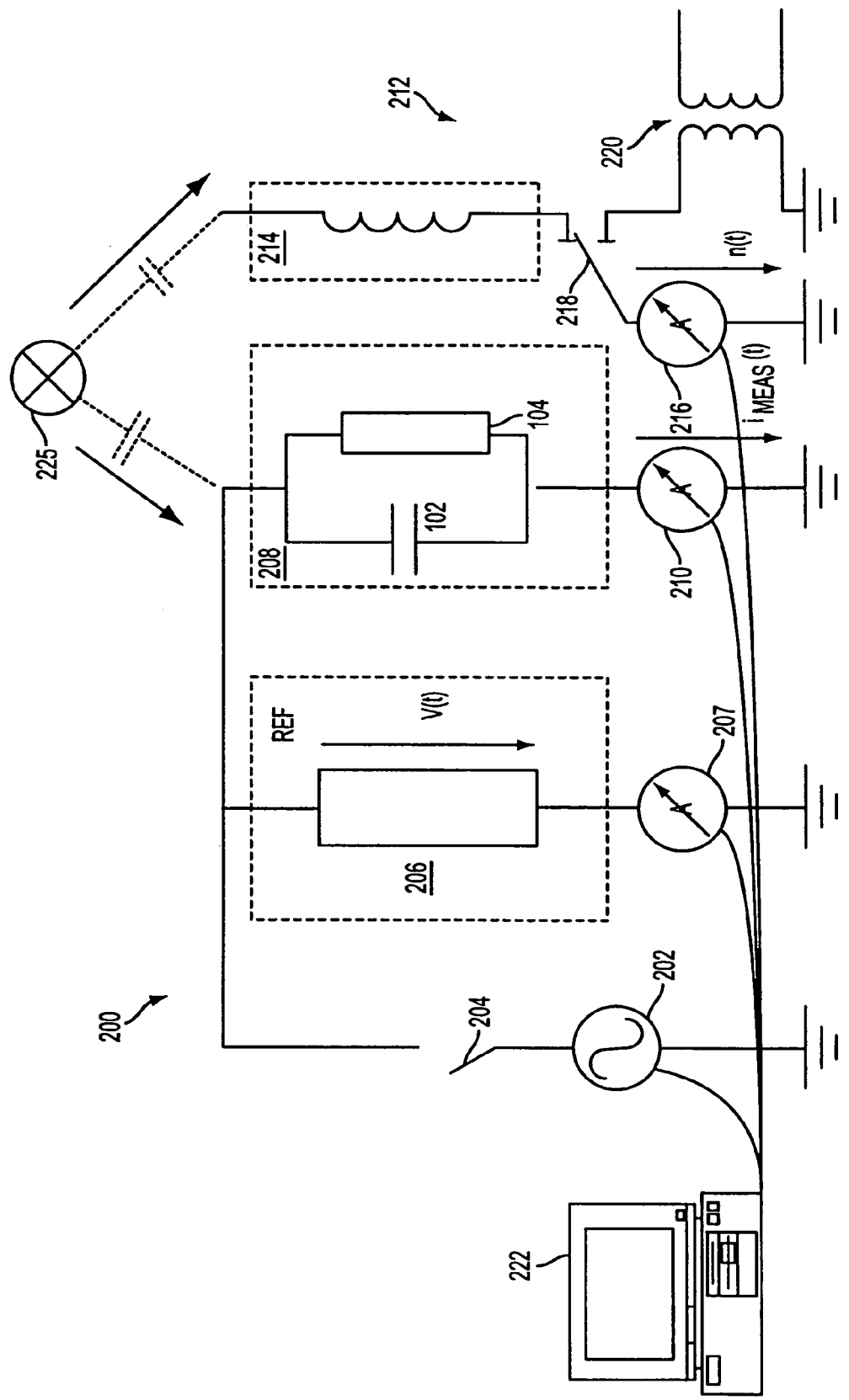
FIG. 2 is a schematic illustrating a system to measure real and reactive power of an impedance and eliminating an induced interference signal value in accordance with an embodiment of the present invention.

The test system 200 of FIG. 2 comprises an AC electrical source 202 coupled with a device under test via a switch mechanism 204. The device under test, shown collectively as element 208, is represented by the model of FIG. 1, having an ideal capacitance value 102 and a parallel resistance value 104. A reference measurement element 206 is electrically coupled in parallel with the device under test 208 and is used to provide a voltage measurement value v(t). This reference measurement element 206 is preferably very accurate over various time and temperature ranges. A meter element 207 is provided electrically coupled in series with the measurement element 206, and a meter element 210 is provided electrically coupled in series with the device under test 208 to provide a current measurement value $i_{MEAS}^{(T)}$.

At a minimal distance, a parallel additional channel 212 is provided to determine an induced interference signal $n^{(t)}$. In the embodiment shown in FIG. 2, the parallel additional channel 212 comprises a meter element 216 which receives a signal from an antennae element 214, or from a power line signal coupling element 220. The switch 218 selects the origin of the signal to provide an induced interference signal measurement value $n^{(t)}$. Each element 206, 207, 210 and 216 are comprised of devices well known to those skilled in the art, therefore detailed descriptions thereof are omitted The meter element 207 measures the current through the reference element 206, the meter element 210 measures the current through the device under test 208 and the meter element 216 measures the signal coming from the antenna signal 214 or from the power line signal coupling element 220. Each of meter elements 207, 210 and 216 are coupled with a test processor 222, such as a computer, for digitizing results and providing calculation features described in greater detail below.

The antennae element 214 can be provided to determine external influences, such as those resulting from a nearby powerline 225, shown producing an induced signal upon the device under test 208. In this case, the signal measured at element 216 is proportional to the nearby powerline element 225 produced disturbance (i.e., interference signal). In a substantially similar manner, the parallel additional channel 220 can be used to also provide an induced interference signal measurement value $n^{(t)}$. In this case, the signal from the powerline coupling element 220 should be in relation with the nearby powerline element 225, i. e., should have the same frequency.

In the measurements provided by the embodiment of the present invention, the value $n^{(t)}$ which can be corrected by amplitude and phase ratio, can then be subtracted from the value $i_{MEAS}^{(T)}$. In doing so, the embodiment of the present invention controls the test system such that the interference signals can be correctly subtracted with relation to an actual amplitude value. This allows the embodiment of the present invention to achieve highly accurate results and allows measuring v(t) and $i_{MEAS}^{(T)}$ at or very close to power line frequency values.

Figure 3:
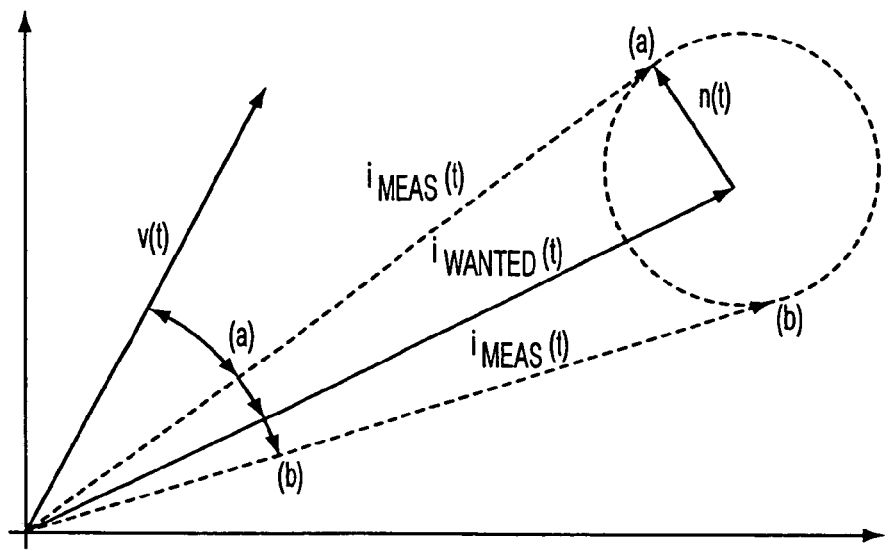
FIG. 3 is a vector diagram which shows the influence of the interference signal $n^{(t)}$ on the wanted signal $i_{WANTED}^{(t)}$.

The influence of interference signals on measurement values is more clearly shown in FIG. 3. The vector diagram of FIG. 3 shows the influence of the interference signal $n^{(t)}$ on the desired signal $i_{WANTED}^{(t)}$. Because the interference signal $n^{(t)}$ does not have the same frequency as the AC source used, the interference vector $n^{(t)}$ rotates around the head of $i_{WANTED}^{(t)}$. Therefore, the real measured current sum signal, as defined below in equation (3), $$i_{MEAS}^{(T)} = i_{WANTED}^{(t)} + n^{(t)} \quad (3)$$

can oscillate between positions (a) and (b) of the graph of FIG. 3. The phase between v(t) and $i_{MEAS}^{(T)}$ can oscillate as well. Unfortunately, as all desired measurement values such as power factor, dissipation factor, and so forth, are calculated from the signals v(t) and $i_{MEAS}^{(T)}$, which are affected by the interference $n^{(t)}$, all the desired values can be inaccurate and unstable. However, the embodiment of the present invention when implemented as described below, substantially eliminates the interference influence and provides accurate measurements.

Specifically, the embodiment of the present invention first sets up the connections between the device under test 208, the antenna 214 or power line source 220, and the test processor 222 via elements 207, 210 and 216. The position of the equipment and cabling is set for initial interference calibration and later measurement (i.e., at a distance to a nearby powerline 225).

In a second step, the test processor 222 sets the AC source 202 to zero (i.e., no signal) and/or opens the switch element 204, and therefore, all measured signals are now provided solely by external interference.

Figure 4A:
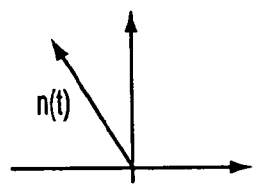
FIG. 4A is a vector diagram illustrating the interference signal $n^{(t)}$ on the measurement channel.

In a third step, the test processor 222 measures the interference signal $n^{(t)}$ on the measurement channel (i.e. through the device under test 208) via elements 207 and 210. A vector example for the interference signal $n^{(t)}$ on the measurement channel is shown in FIG. 4A. The test processor 222 further measures the interference signal $n'^{(t)}$ on the additional measurement channel 212 via element 216. A vector example for the interference signal $n'^{(t)}$ on the additional measurement channel 212 is shown in FIG. 4B.

Figure 4B:
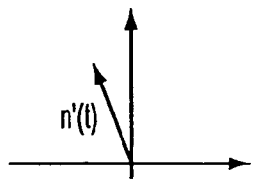
FIG. 4B is a vector diagram illustrating the interference signal $n'^{(t)}$ on the additional measurement channel.

In a fourth step, the test processor 222 then calculates the ratio of phase (i.e., PR) and amplitude (i.e., AR) between the interference signal $n^{(t)}$ of the measurement channel of FIG. 4A, and the interference signal $n'^{(t)}$ of the additional interference channel of FIG. 4B, and stores these values. These values are then used for the calibration of geometrical and environmental differences between the measurement channel and the additional interference channel.

Figure 5:
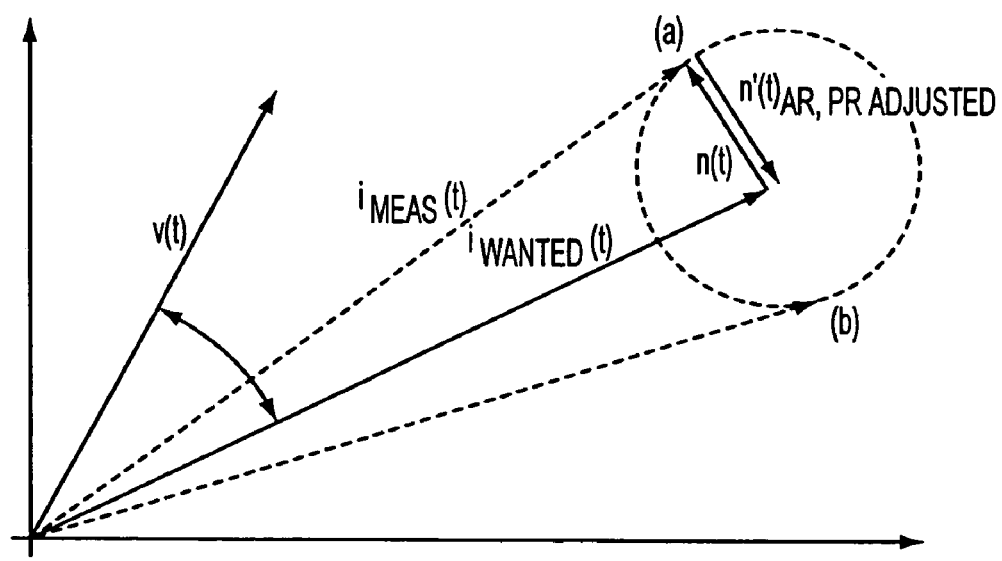
FIG. 5 is a vector diagram illustrating the actual interference-free current signal value $i_{WANTED}^{(t)}$ measured in accordance with an embodiment of the present invention.

In a fifth step, the test processor 222 sets the AC source 202 to the desired voltage and frequency values, and then measures the resulting signals v(t) and $i_{MEAS}^{(T)}$ via elements 206 and 210, and measures the interference signal $n'^{(t)}$ on the additional measurement channel via element 216. The test processor 222 continuously subtracts the measured interference signal $n'^{(t)}$, adjusted by the previously stored ratios AR and PR, from the measured device under test 208 current signal. The result is the actual interference-free current signal value $i_{WANTED}^{(t)}$ at or near the power line frequency as shown in FIG. 5.

In a sixth step, the test processor 222 then determines the real and reactive power, loss angle, power factor, and so forth of the device under test 208 impedance at or near power line frequency from this calculated current $i_{WANTED}^{(t)}$ and the voltage v(t).

While one embodiment has been chosen to illustrate the invention, it will be understood by those skilled in the art that various changes and modifications can be made therein without departing from the scope of the invention as defined in the appended claims.

What is claimed is:

1. A method for accurately measuring the real and reactive power of a system or component at a predetermined line frequency, comprising the steps of:

providing a measurement channel and an additional measurement channel and setting a source coupled to a device under test in the measurement channel to zero;

measuring an interference signal $n^{(t)}$ on the measurement channel and measuring an interference signal $n'^{(t)}$ on the additional measurement channel;

calculating a phase ratio and an amplitude ratio between the interference signal $n^{(t)}$ and the interference signal $n'^{(t)}$;

setting the source to a desired voltage and frequency value and measuring a voltage v(t) and current $i_{MEAS}^{(T)}$ signal on the measurement channel, and measuring an interference signal $n'^{(t)}$ on the additional measurement channel, wherein the measured interference signal $n'^{(t)}$ is adjusted by the phase and amplitude ratio and is continuously subtracted from the $i_{MEAS}^{(T)}$ signal; and calculating at least one of a real and reactive power, loss angle, and power factor of the device under test using the measured v(t) and adjusted $i_{MEAS}^{(T)}$ signal.

2. A method for accurately measuring the real and reactive power of a system or component as claimed in claim 1, further comprising the step of:

digitizing at least one of the v(t) and $i_{MEAS}^{(T)}$ signal on the measurement channel, the interference signal $n^{(t)}$ and the interference signal $n'^{(t)}$.

3. A method for accurately measuring the real and reactive power of a system or component as claimed in claim 1, wherein the interference signal $n^{(t)}$ comprises an effect induced by at least one of a nearby power line and a powerline signal.

4. A method for accurately measuring the real and reactive power of a system or component as claimed in claim 1, wherein the interference signal $n'^{(t)}$ comprises an effect induced by at least one of a nearby power line and a powerline signal.

5. A method for accurately measuring the real and reactive power of a system or component as claimed in claim 1, further comprising the step of:

providing said measurement over a short time period such that geometrical and environmental effects are minimal.

6. A method for measuring the real and reactive power of impedance of a power system at a predetermined line frequency, comprising the steps of:

calculating and storing a ratio of amplitude and phase between an interference current through a device under test and an interference signal on an additional channel while providing the device under test with a substantially zero voltage;

providing the device under test with a voltage substantially at a line frequency;

measuring at least one interference signal imposed to the device under test using the additional channel;

digitizing a current and voltage of the device under test and the interference signal and transferring each to a processor; and adjusting the interference signal using the stored ratio and subtracting the adjusted interference signal from the current signal through the device under test so as to measure the real and reactive power of an impedance substantially at line frequency.

7. A method for measuring the real and reactive power of impedance of a power system at a predetermined line frequency, comprising the steps of:
  setting up a connection between a device under test electrically coupled in a measurement channel and at least one of an antenna and a power line source electrically coupled in an additional measurement channel, to a measuring instrument configured, for interference measurement or calibration;
  calibrating said measuring instrument by setting a power source electrically coupled to the device under test to zero volts such that all measured signals on both the measurement channel and the additional measurement channel are due to interference;
  calculating and storing a ratio of phase and amplitude between the interference signal of the measurement channel and the interference signal of the additional measurement channel;
  calibrating the geometrical and environmental differences between said measuring channel and additional measurement channel;
  setting the power source electrically coupled to the device under test to a desired voltage and frequency value, and measuring at least one device under test signal while continuously subtracting the measured interference signal adjusted by the ratio from the measured device under test signal; and
  calculating at least one of a real and reactive power, loss angle and power factor of the device under test impedance substantially at power line frequency.

8. A method of measuring the insulation impedance of an electrical component, in which an interference signal is measured and adjusted, and the adjusted interference signal subtracted from the test signal, comprising the steps of:
  measuring and determining at least one effect of an interference upon a test object;
  measuring and determining at least one effect of an interference upon an antenna or resulting directly from a power line of the test object;
  calculating and storing a ratio of amplitude and phase between the interference of the test object and the interference of the antenna;
  measuring an interference signal at a power line frequency and adjusting the measured interference signal using the ratio of amplitude and phase, and subtracting the adjusted measured interference signal from a measured current signal through the device under test at or near power line frequency to produce an interference-free current signal; and
  calculating from said interference-free current signal through the device under test and a voltage signal at least one of a real and reactive power, loss angle, and power factor of an impedance at or near power line frequency.

9. An apparatus for measuring the insulation impedance of an electrical component, comprising:
  a first measurement element electrically coupled with a first measurement channel to measure interference of a power line by an antenna or directly from a power line;
  a second measurement element electrically coupled with a second measurement channel to synchronously capture a voltage and current waveform at or near line frequencies; and
  a test processor electrically coupled with the first and second measurement elements for receiving and adjusting the interference measurement, receiving said captured waveforms and subtracting the adjusted interference measurement from the captured waveforms to measure an interference-free current, and using the captured voltage and interference-free current to determine the impedance at or near line frequencies.

10. An apparatus for measuring the real and reactive power of impedance of a power system at a predetermined line frequency, comprising:
  a test apparatus for coupling with a device under test, having a voltage at or near line frequency applied;
  an additional channel to measure at least one of an interference signal of a line frequency imposed to the device under test;
  a digitizer to digitize a current and a voltage at the device under test and the interference signal;
  a processor to determine a ratio of amplitude and phase between an interference current through the device under test and the interference signal on the additional channel; and
  said processor further provided to continuously subtract the additional interference signal corrected by phase amplitude from the current signal through the device under test so as to measure the real and reactive power of an impedance substantially at the line frequency.

11. An apparatus for measuring the real and reactive power as claimed in claim 10, wherein said interference signal is imposed to the test object by at least one of an external powerline and a powerline signal.

12. An apparatus for measuring the real and reactive power as claimed in claim 10, wherein said test apparatus comprises:
  a switchable ac source;
  a voltage measurement device in electrical communication with said switchable ac source and in parallel with said device under test; and
  a current measurement device in electrical communication with said switchable ac source and in series with said device under test.

13. An apparatus for measuring the real and reactive power as claimed in claim 10, wherein said additional channel comprises:
  an antennae;
  a switchable powerline signal coupling element in electrical communication with said antennae; and
  a measurement device in electrical communication with said antennae.

* * * * *